(12) United States Patent
Elwart, II et al.

(10) Patent No.: US 9,136,796 B2
(45) Date of Patent: Sep. 15, 2015

(54) NEGATIVE AUDIO SIGNAL VOLTAGE PROTECTION CIRCUIT AND METHOD FOR AUDIO GROUND CIRCUITS

(71) Applicant: Texas Instruments Incorporated, Dallas, TX (US)

(72) Inventors: David H. Elwart, II, Sachse, TX (US); Vikas Suma Vinay, Dallas, TX (US); Christopher M. Graves, Sherman, TX (US); Baher S. Haroun, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 263 days.

(21) Appl. No.: 13/920,302

(22) Filed: Jun. 18, 2013

(65) Prior Publication Data
US 2014/0369520 A1 Dec. 18, 2014

(51) Int. Cl.
*H04B 15/00* (2006.01)
*H03F 1/30* (2006.01)
*H02H 9/04* (2006.01)

(52) U.S. Cl.
CPC ............... *H03F 1/305* (2013.01); *H02H 9/045* (2013.01)

(58) Field of Classification Search
CPC ......... G06K 15/00; H03J 5/0209; H03J 5/246
USPC ............ 381/94.1, 123, 120, 121, 107, 28, 55, 381/104, 113; 361/56; 330/250, 252, 258, 330/277, 251, 270 R
See application file for complete search history.

(56) References Cited

U.S. PATENT DOCUMENTS

| | | | |
|---|---|---|---|
| 5,604,785 A * | 2/1997 | Pryor et al. | 379/2 |
| 2004/0207965 A1* | 10/2004 | Ausserlechner | 361/56 |
| 2006/0008097 A1* | 1/2006 | Stenberg et al. | 381/113 |
| 2012/0236444 A1* | 9/2012 | Srivastava et al. | 361/56 |
| 2013/0272547 A1* | 10/2013 | Waller, Jr. | 381/120 |

FOREIGN PATENT DOCUMENTS

| | | |
|---|---|---|
| WO | WO 9401960 | 1/1994 |
| WO | WO 2012125767 | 9/2012 |

\* cited by examiner

*Primary Examiner* — Lun-See Lao
(74) *Attorney, Agent, or Firm* — Alan A. R. Cooper; Frank D. Cimino (57) ABSTRACT

Self-grounded circuitry (10) includes a signal channel conducting an output voltage ($V_{OUT1}$). A charge pump (2) powered by a reference voltage ($V_{DD}$) produces a control voltage ($V_{CP}$). The control signal is at a low level if the reference voltage is low and is boosted to a high level if the reference voltage is high. A ground switch circuit (15) includes a depletion mode transistor (MP1) having a source coupled to the output voltage, a gate coupled to the control voltage, and a drain coupled to ground. The transistor includes a well region (4-1) and a parasitic substrate diode (D3-1). A negative voltage protection circuit (17-1) includes a depletion mode first protection transistor (MP3-1) having a drain coupled to the well region, a source coupled to a source of a depletion mode second protection transistor (MP4-1) having a drain coupled to the output voltage, the first and second protection transistors each having a gate coupled to the control voltage, and also includes a diode (MN1) coupled to charge the well region from the control voltage conductor to prevent distortion of the output voltage.

20 Claims, 4 Drawing Sheets

NEGATIVE AUDIO SIGNAL VOLTAGE PROTECTION CIRCUIT AND METHOD FOR AUDIO GROUND CIRCUITS

BACKGROUND OF THE INVENTION

The present invention relates generally to "audio ground switches" that include depletion mode MOS transistors which function as audio ground switches connected to prevent build-up of charge that may result in discharging and associated popping sounds when a headset is plugged into an audio signal jack of a device generating the audio signal.

The discharge of the above-mentioned charge build-up occurs because an audio ground switch, along with circuitry connected to it, have parasitic capacitances, inductances, and resistances that are subject to build up of static charge which can be discharged similarly to common electrostatic discharge (ESD). The above-mentioned built-up charge in audio ground switch circuitry may be electrostatically discharged to ground at the instant a headset is connected to circuitry connected to the audio ground switch. The resulting current through the headset speaker resistance may cause the above-mentioned clicking/popping sounds.

Figure 1:
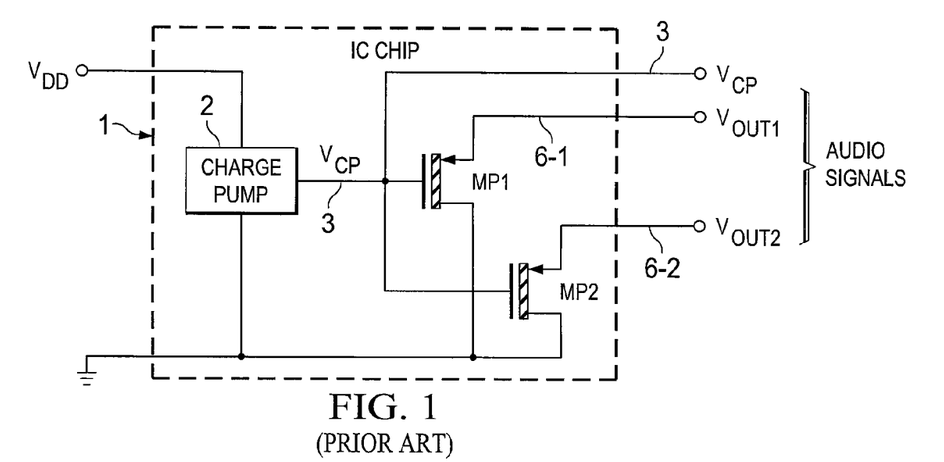
FIG. 1 is a schematic diagram of a conventional audio ground switch circuit.

Referring to FIG. 1, a conventional audio ground switch circuit 1 is implemented in an integrated circuit chip that includes a conventional charge pump 2 coupled between a positive supply voltage $V_{DD}$ and a system ground. Charge pump 2 produces an output voltage $V_{CP}$ on conductor 3. Charge pump 2 includes conventional internal circuitry that discharges $V_{CP}$ to zero volts if $V_{DD}$ falls below an undervoltage "lockout threshold" voltage. The charge pump output voltage $V_{CP}$ is connected by conductor 3 to the gate electrodes of P-channel MOS (metal oxide semiconductor) depletion mode field effect transistors MP1 and MP2 which normally are in their conductive ON states when $V_{CP}$ is at zero volts. When $V_{DD}$ is at a normal level, for example 3.3 volts, then charge pump output voltage $V_{CP}$ is at a boosted level, for example 7 volts. The source of depletion mode ground switch transistor MP1 is connected to a conductor 6-1 having an audio information signal voltage $V_{OUT1}$ thereon, and the source of depletion mode ground switch transistor MP2 is connected to a conductor 6-2 having an audio information signal voltage $V_{OUT2}$ thereon. The source electrodes of depletion mode transistors MP1 and MP2 are limited to a sufficiently low voltage that, combined with the boosted charge pump voltage $V_{CP}$, they produce a sufficiently large gate-to-source reverse bias voltage VGS to change the state of depletion mode transistors MP1 and MP2 from their conductive regions of operation to their cutoff regions.

Figure 2:
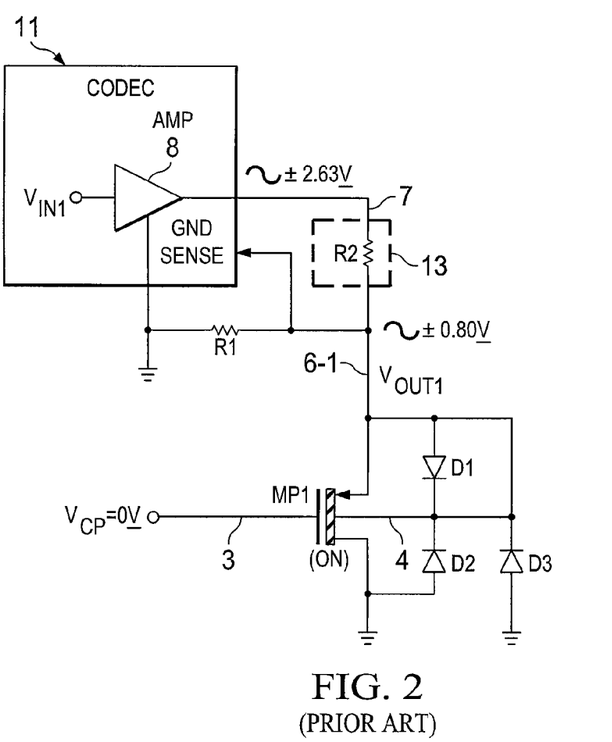
FIG. 2 is a schematic diagram illustrating parasitic diodes associated with depletion mode field effect transistor MP1 in FIG. 1 and an audio amplifier and resistive voltage divider coupled to the drain of transistor MP1 for the case when transistor MP1 is in its ON condition.

FIG. 2 shows the connections and signals associated with depletion mode transistor MP1 in more detail for the case in which $V_{DD}$ is equal to zero. Depletion mode transistor MP1 has P-type source and drain regions formed in an N-type well region 4 of depletion mode transistor MP1. The P-type source and the N-type well region form an associated parasitic diode D1 which has a substantial parasitic capacitance, and the P-type drain and the N-type well region 4 of depletion mode transistor MP1 form an associated parasitic diode D2 which also has a substantial parasitic capacitance. The N-type well region 4 is formed on a P-type substrate and together they form an associated parasitic substrate diode D3. (See the integrated circuit section view of depletion mode transistor MP1 in subsequently described FIG. 5.) If MP1 is "open" in its high impedance OFF state, a large negative voltage on conductor 6-1 will certainly forward bias substrate diode D3-1, but that is not the case if MP1 is conductive and therefore acting like a ground switch. If MP1 is in its conductive ON state, it is unlikely that any audio signal would be present because it would not be able to be developed across the parallel combination of the ground resistor R1-1 and the low channel resistance of MP1, which might be somewhere between 0.1 and 1.0 ohms.

A relatively large-amplitude audio signal having a range of, for example, ±2.63 volts may be produced on conductor 7 by an audio amplifier 8 in a conventional CODEC (coder-decoder) 11. That audio signal is coupled across a resistive voltage divider including a 16 ohm headset resistance R2 (of a headset 13) coupled between the output 7 of audio amplifier 8 and $V_{OUT1}$ conductor 6-1 and a 7 ohm "ground resistor" R1 coupled between $V_{OUT1}$ conductor 6-1 and ground. Audio amplifier 8 also is referenced to ground. (Audio engineers sometimes connect a "ground resistor" such as resistor R1 in series with the system ground to reduce or eliminate so-called "ground noise".) The divided-down output signal produced by audio amplifier 8 appears as $V_{OUT1}$ on conductor 6-1 and would have a range of ±0.8 volts if depletion mode transistor MP1 in FIG. 2 were OFF instead of ON. However, since depletion mode transistor MP1 in FIG. 2 is in its ON condition, its very low channel resistance is in parallel with ground resistor R1 and causes $V_{OUT1}$ to be essentially equal to zero. Note however, that audio signals usually are not present while the depletion mode field effect transistor MP1 is in its conductive or ON state. The signal on conductor 6-1 is typically used to provide internal compensation in audio CODEC 11.

Figure 3:
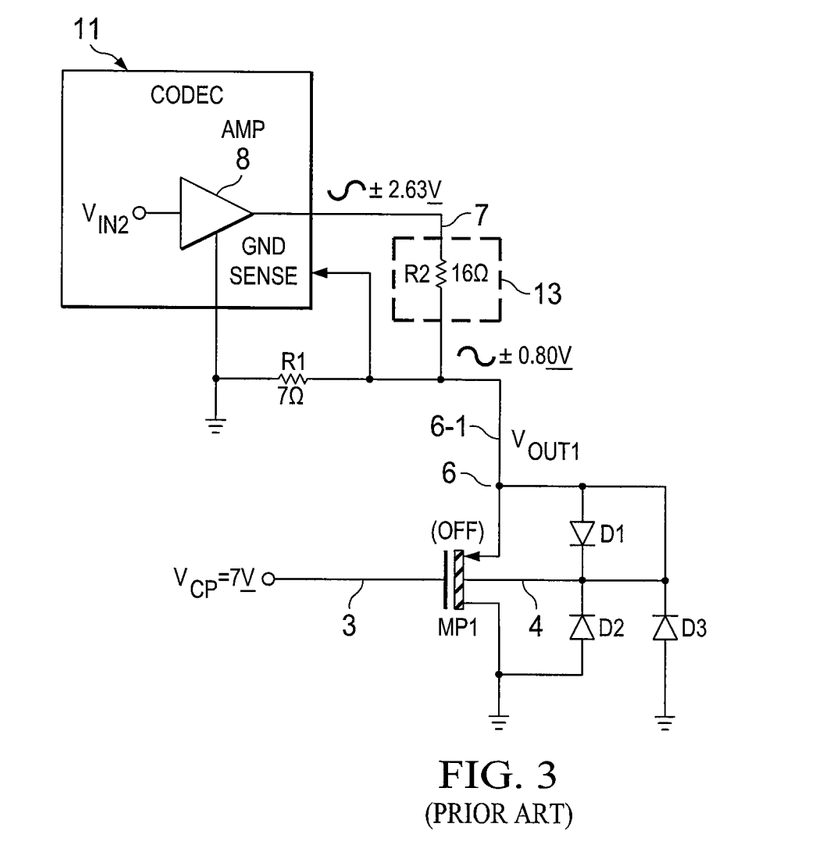
FIG. 3 is a schematic diagram the circuit of FIG. 2 for the case when sufficient supply voltage is applied to the charge pump to cause it to turn off depletion mode field effect transistor MP1.

FIG. 3 shows the same structure shown in FIG. 2, but in this case $V_{DD}$ is not equal to zero. Instead, $V_{DD}$ has a sufficiently large value to cause charge pump output voltage $V_{CP}$ to be equal to approximately +7 volts, which results in a magnitude of the gate-to-source voltage (VGS) of depletion mode transistor MP1 sufficiently high to switch depletion mode transistor MP1 completely OFF into its high-impedance state. In this case the audio signal on amplifier output conductor 7 typically is present, so the full ±0.8 volt output value of $V_{OUT1}$ is produced on conductor 6-1 by the voltage division of the audio amplifier output voltage on conductor 7 by the headphone resistance R2 and the ground resistance R1. The same circuitry shown for depletion mode transistor MP1 in FIGS. 2 and 3 can, of course, also be utilized for depletion mode transistor MP2 in FIG. 1.

The prior art ground switch integrated circuit of Prior Art FIGS. 1-3 provide a very low resistance in parallel with ground resistor R1 when no power is being applied to the charge pump 2 (i.e., when $V_{DD}$=0), and ground switch integrated circuit of FIGS. 1-3 also turns the depletion mode transistor MP1 off whenever adequate $V_{DD}$ power is being applied to charge pump 2 such that audio information $V_{OUT1}$ can be produced on conductor 6-1 and applied to the ground sensing input of audio CODEC 11 for processing.

The direct connection of N-type well 4 to $V_{OUT1}$ conductor 6-1 prevents forward biasing of parasitic diode D1 including the PN junction between the P-type source and the N-type well region 4 of depletion mode transistor MP1 when $V_{OUT1}$ is positive. Unfortunately, if depletion mode transistor MP1 is switched into its high impedance OFF state, then the −0.8 volt portion of the AC signal $V_{OUT1}$ on conductor 6-1 may cause parasitic diodes D2 and D3 to become forward biased, and that introduces a large amount of distortion into the system audio signal $V_{OUT1}$.

If speaker or headset 13 is plugged into the headset jack of a personal computer or the like when depletion mode transistor MP1 is OFF, and if the audio volume is turned up to its maximum level during a "no audio event" (i.e., when no desired audio signal such as a music signal is being provided), an annoying audio frequency ground noise signal or "audio frequency hum" may be heard from the headset speaker resistance represented by resistor R2. The 7 ohm noise reduction resistor R1 in the ground path and the headset resistance R2 function together as a voltage divider that reduces the magnitude of the maximum negative voltage swing of $V_{OUT1}$ (−0.8 volts in this example) in order to prevent forward biasing of the substrate diode D3 formed by the P-type source and the diode D2 formed by N-type well region 4 of depletion mode transistor MP1. The 7 ohm ground resistor R1 reduces the audio hum amplitude during such a "no audio" event. The R1 ground sense resistor is needed to provide a ground sense input signal to the CODEC 11. This ground sense input signal is then used to cancel the noise of the ground signal. The need for this function causes the relatively large-magnitude signal of +/−0.8 volts to appear on $V_{OUT1}$ conductor 6-1.

Typically, there will be some charge buildup on the parasitic capacitances associated with the ground conductor and/or the audio signal conductor 6-1 when no $V_{DD}$ power is being applied to charge pump 2. The main reason for requiring audio ground switches is to provide resistive paths for discharge of such charge buildup is resulting from plugging a headset into a headset jack to receive the audio signal $V_{OUT1}$ to thereby prevent a sudden electrical discharge through the headset resistance R2 and thereby preventing the annoying clicking/popping sounds.

When the audio signal voltage $V_{OUT1}$ is present on conductor 6-1 and is applied to the drain of depletion mode ground switch transistor MP1 in FIGS. 1-3, then a −0.8 volt value of $V_{OUT1}$ on conductor 6-1 appears on the cathode of substrate diode D3, forward biasing it and causing a large amount of distortion in $V_{OUT1}$. The main functions of the depletion mode transistor MP1 in its ON state are to prevent static charge buildup and to dampen or slow down any discharge of built-up static charge when the headset 13 is plugged in.

Thus, there is an unmet need for improved audio ground switch circuitry that prevents buildup of charge and thereby prevent subsequent discharge thereof in depletion mode ground switch transistors under all operating conditions without compromising the quality of desired audio signals that are present.

There also is an unmet need for improved audio ground switch circuitry that prevents negative portions of an audio signal from causing ground switch circuitry receiving the audio signal to produce distortion in the audio signal.

There also is an unmet need for improved audio ground switch circuitry that prevents popping sounds caused by discharging of charge built up in the audio ground switch circuitry at the instant at which a headset is plugged into a jack receiving an audio signal.

There also is an unmet need for improved audio ground switch circuitry that enables use of higher resistance ground resistors without causing distortion of an audio signal received by the audio ground switch circuitry.

SUMMARY OF THE INVENTION

Is an object of the invention to provide improved audio ground switch circuitry that prevents buildup of charge and thereby prevents subsequent discharge thereof in depletion mode ground switch transistors under all operating conditions without compromising the quality of desired audio signals that are present.

It is another object of the invention to provide improved audio ground switch circuitry that prevents negative portions of an audio signal from causing ground switch circuitry receiving the audio signal to distort the audio signal.

Is another object of the invention to provide improved audio ground switch circuitry that prevents popping sounds caused by discharging of charge built up in the audio ground switch circuitry at the instant at which a headset is plugged into a jack receiving an audio signal.

It is another object of the invention to provide improved audio ground switch circuitry that enables use of higher resistance ground resistors without causing distortion of an audio signal received by the audio ground switch circuitry.

Briefly described, and in accordance with one embodiment, the present invention provides self grounded circuitry (10) including a signal channel conducting an output voltage ($V_{OUT1}$). A charge pump (2) powered by a reference voltage ($V_{DD}$) produces a control voltage ($V_{CP}$). The control signal is at a low level if the reference voltage is low and is boosted to a high level if the reference voltage is high. A ground switch circuit (15) includes a depletion mode transistor (MP1) having a source coupled to the output voltage, a gate coupled to the control voltage, and a drain coupled to ground. The transistor includes a well region (4-1) and a parasitic substrate diode (D3-1). A negative voltage protection circuit (17-1) includes a depletion mode first protection transistor (MP3-1) having a drain coupled to the well region, a source coupled to a source of a depletion mode second protection transistor (MP4-1) having a drain coupled to the output voltage, the first and second protection transistors each having a gate coupled to the control voltage, and also includes a diode (MN1) coupled to charge the well region from the control voltage to prevent distortion of the output voltage by always keeping the substrate diode reverse biased.

In one embodiment, the invention provides self-grounded circuitry (10) including a first signal channel conducting a first output signal ($V_{OUT1}$) on a first output conductor (6-1); a charge pump (2) powered by a first reference voltage ($V_{DD}$) and producing a control voltage signal ($V_{CP}$) on a control conductor (3,$V_{CP}$), the control voltage signal ($V_{CP}$) having a relatively low value if the first reference voltage ($V_{DD}$) is at a relatively low level and having a relatively high value if the first reference voltage ($V_{DD}$) is at a relatively high level; a ground switch circuit (15) including a first depletion mode transistor (MP1) having a source coupled to the first output conductor (6-1), a gate coupled to receive the control voltage signal ($V_{CP}$), and a drain coupled to a second reference voltage (GND), the first depletion mode transistor (MP1) having a first well region (4-1), a first parasitic diode (D1-1) including a PN junction between the source (14 in FIG. 5) and the first well region (4-1 in FIG. 5), a second parasitic diode (D2-1) including a PN junction between the drain (16 in FIG. 5) and the first well region (4-1), and a third parasitic diode (D3-1) including a PN junction between the first well region (4-1) and a substrate (19 in FIG. 5) ajoining the first well region (4-1); and a first negative voltage protection circuit (17-1) including a first depletion mode protection transistor (MP3-1) having a drain coupled to the first well region (4-1), a source coupled to a source of a second depletion mode protection transistor (MP4-1) having a drain coupled to the first output conductor (6-1), the first (MP31) and second (MP4-1) depletion mode protection transistors each having a gate coupled to the control conductor (3,$V_{CP}$), and a level-shifting circuit (MN1) coupled between the first well region (4-1) and the control conductor (3,$V_{CP}$). In a described embodiment, the diode (MN1) is a diode-connected enhancement mode transistor having a source coupled to the first well region (4-1) and a gate and drain coupled to the control conductor (3,$V_{CP}$). Well regions of the first (MP3-1) and second (MP4-1) depletion mode protection transistors are connected to their sources, respectively. In a described embodiment, the first output signal ($V_{OUT1}$) is an audio frequency signal.

In one embodiment, the first signal channel (8-1,R1-1,R2-1,6-1) includes a first amplifier (8-1), a resistive voltage divider including a first ground noise resistor (R1-1) coupled between the first output conductor (6-1,$V_{OUT1}$) and the second reference voltage (GND), and a first resistance (R2-1) of a speaker of an external headset (13-1) coupled between an output (7-1) of the first amplifier (8-1) and the first output conductor (6-1,$V_{OUT1}$). In one embodiment the first ground noise resistor (R1-1) has a resistance of approximately 7 ohms and wherein the first resistance (R2-1) has a value of approximately 16 ohms.

In one embodiment, the first depletion mode transistor (MP1) is a P-channel MOS depletion mode transistor and the diode-connected enhancement mode transistor (MN1) is a N-channel enhancement mode MOS transistor. A channel-width-to-channel-length ratio of the enhancement mode transistor (MN1) is substantially less than a channel-width-to-channel-length ratio of the first depletion mode transistor (MP1).

In one embodiment, the first well region (4-1) is an N-type well region adjoining a P-type substrate (19). In one embodiment, the diode-connected enhancement mode transistor (MN1) charges the first well region (4-1) to a voltage equal to the control voltage signal ($V_{CP}$) minus a forward threshold voltage ($V_T$) of the diode-connected enhancement mode transistor (MN1) when the first reference voltage ($V_{DD}$) substantially exceeds the relatively low level. The first depletion mode protection transistor (MP3-1) and the second depletion mode protection transistor (MP4-1) cooperate to perform the functions of allowing the well region (4-1) to be charged to the voltage level of the first output conductor (3,$V_{OUT1}$) while the first depletion mode transistor (MP1) is in its ON condition, and wherein a parasitic diode (D7-1) associated with the second depletion mode protection transistor (MP4-1) prevents escape of charge from the well region (4-1) while the first depletion mode transistor (MP1) is in its OFF condition. In one embodiment, a body electrode of the diode-connected enhancement mode transistor (MN1) is connected to the second reference voltage (GND). In one embodiment, the first well region (4-1) is an N-type semiconductor layer disposed on a P-type semiconductor substrate, the source (14) and the drain (16) of the first depletion mode transistor (MP1) are P-type regions in the first well region (4-1) and are separated by a P-type channel region (20) in the first well region (4-1).

In one embodiment, the first negative voltage protection circuit (17-1) operates so as to both prevent clicking/popping sounds when the headset (13-1) is plugged into a jack connected to the first output conductor (6-1) and eliminate audio hum signals from the first output conductor (6-1) if the first output signal ($V_{OUT1}$) is not present and the first depletion mode transistor (MP1) is in an OFF condition.

In one embodiment, the charge pump (2) operates to cause the control voltage signal ($V_{CP}$) to be equal to approximately zero if the first reference voltage ($V_{DD}$) is at a relatively low level.

In one embodiment, a second signal channel conducts a second output signal ($V_{OUT2}$) on a second output conductor (6-2), and a second depletion mode transistor (MP2) has a source coupled to the second output conductor (6-2) and a structure essentially the same as the first depletion mode transistor (MP1), and a second well region protection circuit (17-2) is essentially the same as the first well region protection circuit (17-1).

In one embodiment, the invention provides a method for preventing distortion of an output signal ($V_{OUT1}$) caused by ground switch circuitry (15) in a self-grounding switch circuit (10), the method including providing the output signal ($V_{OUT1}$) on a second output conductor (6-1); operating a charge pump (2) powered by a second reference voltage ($V_{DD}$) to produce a control voltage signal ($V_{CP}$) on a control conductor (3,$V_{CP}$), the control voltage signal ($V_{CP}$) having a relatively low value if the first reference voltage ($V_{DD}$) is at a relatively low level and having a relatively high value if the first reference voltage ($V_{DD}$) is at a relatively high level; applying the control voltage signal ($V_{CP}$) and applying it to a gate of a depletion mode ground switch transistor (MP1) having a source coupled to the output conductor (6-1) and a drain coupled to a second reference voltage (GND), the second depletion mode ground switch transistor (MP1) having a well region (4-1), a first parasitic diode (D1-1) including a PN junction between the source (14 in FIG. 5) and the well region (4-1 in FIG. 5), a second parasitic diode (D2-1) including a PN junction between the drain (16 in FIG. 5) and the well region (4-1), and a third parasitic diode (D3-1) including a PN junction between the well region (4-1) and a substrate (19 in FIG. 5) ajoining the well region (4-1); and coupling the well region (4-1) to a drain of a first depletion mode protection transistor (MP3-1) having a drain coupled to the well region (4-1), a source coupled to a source of a second depletion mode protection transistor (MP4-1) having a drain coupled to the output conductor (6-1), coupling a gate of each of the first (MP3-1) and second (MP4-1) depletion mode protection transistors to the control conductor (3,$V_{CP}$), coupling a source of a diode-connected enhancement mode transistor (MN1) to the well region (4-1) and coupling a gate and a drain of the diode-connected enhancement mode transistor (MN1) to the control conductor (3,$V_{CP}$), and coupling well regions of the first (MP3-1) and second (MP4-1) depletion mode protection transistors to their sources, respectively.

In one embodiment the method includes operating the first depletion mode protection transistor (MP3-1) and the second depletion mode protection transistor (MP4-1) to charge the well region (4-1) to the voltage level of the first output conductor (3,$V_{OUT1}$) while the depletion mode transistor (MP1) is in its ON condition, and preventing escape of charge from the well region (4-1) while the first depletion mode transistor (MP1) is in its OFF condition by means of a parasitic diode (D7-1) associated with the second depletion mode protection transistor (MP4-1).

In one embodiment the level-shifting circuits (MN1) is a diode-connected enhancement mode transistor, and the method includes operating the diode-connected enhancement mode transistor (MN1) to charge the well region (4-1) to a voltage equal to the control voltage signal ($V_{CP}$) minus a forward threshold voltage ($V_T$) of the diode-connected enhancement mode transistor (MN1) when the first reference voltage ($V_{DD}$) substantially exceeds the relatively low level.

In one embodiment the method includes using P-channel depletion mode transistors as the depletion mode ground switch transistor (MP1) and as the first and second depletion mode protection transistors (MP3-1) and (MP4-1) and using a N-channel enhancement mode transistor as the diode-connected enhancement mode transistor (MN1).

In one embodiment, the invention provides circuitry (17-1) for preventing distortion of an output signal ($V_{OUT1}$) caused by ground switch circuitry (15) in an AC signal circuit (10), including means (8-1,R1-1,R1-2) for providing the AC output signal ($V_{OUT1}$) on a first output conductor (6-1); a charge pump (2) powered by a first reference voltage ($V_{DD}$) to produce a control voltage signal ($V_{CP}$) on a control conductor (3,$V_{CP}$), the control voltage signal ($V_{CP}$) having a relatively low value if the first reference voltage ($V_{DD}$) is at a relatively low level and having a relatively high value if the second reference voltage ($V_{DD}$) is at a relatively high level; means (3) for applying the control voltage signal ($V_{CP}$) to a gate of a depletion mode ground switch transistor (MP1) having a source coupled to the output conductor (6-1) and a drain coupled to a second reference voltage (GND), the depletion mode ground switch transistor (MP1) having a well region (4-1), a first parasitic diode (D1-1) including a PN junction between the source (14 in FIG. 5) and the well region (4-1 in FIG. 5), a second parasitic diode (D2-1) including a PN junction between the drain (16 in FIG. 5) and the well region (4-1), and a third parasitic diode (D3-1) including a PN junction between the well region (4-1) and a substrate (19 in FIG. 5) ajoining the well region (4-1); means (MP3-1,MP4-1) for charging the well region (4-1) to the voltage level of the first output conductor (3,$V_{OUT1}$) while the first depletion mode ground switch transistor (MP1) is in its ON condition, and preventing escape of charge from the well region (4-1) while the first depletion mode ground switch transistor (MP1) is in its OFF condition by means of a parasitic diode (D7-1) associated with the second depletion mode protection transistor (MP4-1); and means (MN-1) for charging the well region (4-1) to a voltage equal to the control voltage signal ($V_{CP}$) minus a forward threshold voltage ($V_T$) of the diode-connected enhancement mode transistor (MN1) when the first reference voltage ($V_{DD}$) substantially exceeds the relatively low level thereof so the depletion mode ground switch transistor (MP1) is in its OFF condition.

DETAILED DESCRIPTION OF THE PREFERRED EMBODIMENTS

Figure 4:
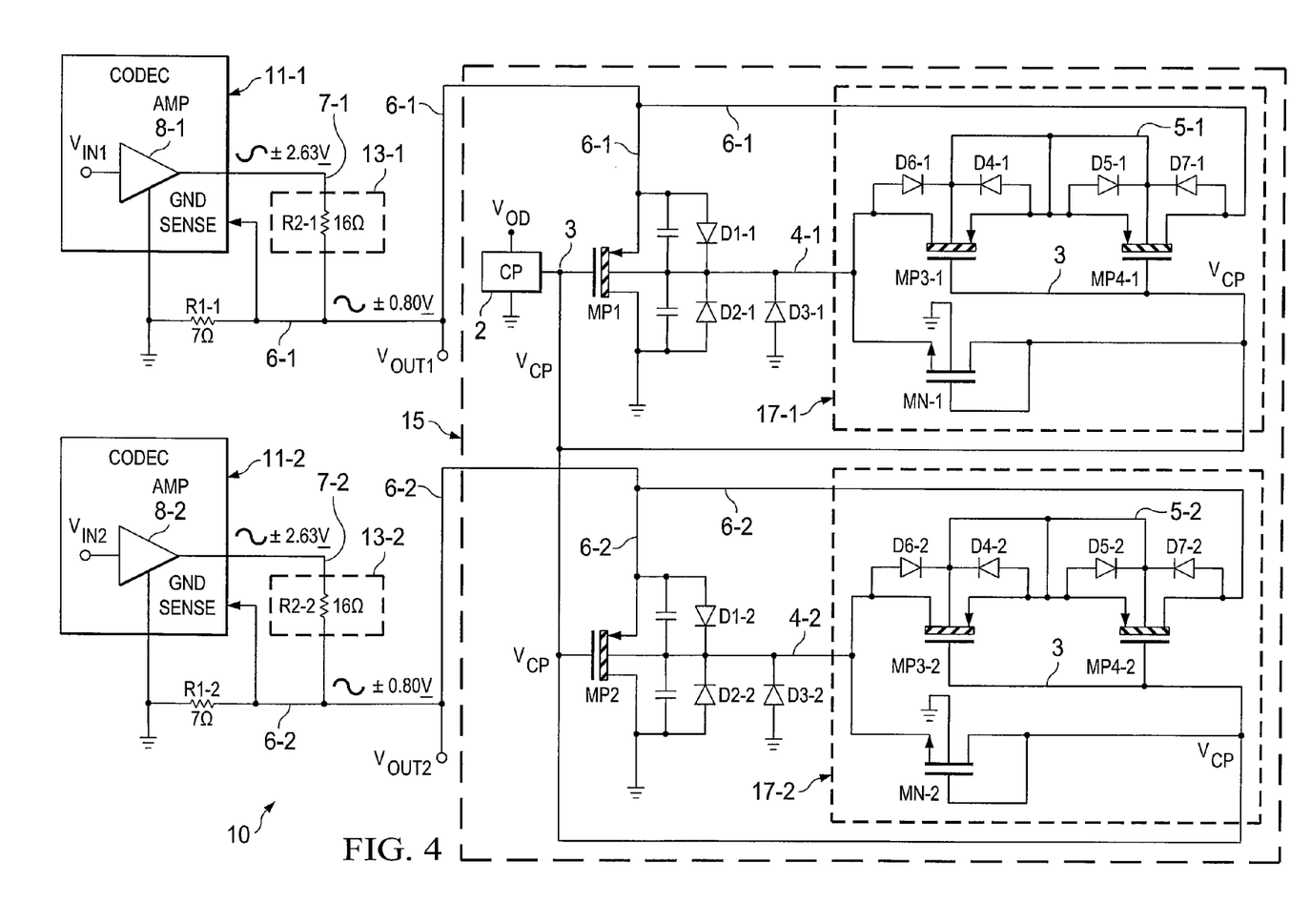
FIG. 4 is a schematic diagram of an audio ground switch circuit that overcomes the shortcomings of the prior art.

FIG. 4 shows an embodiment of a circuit 10 which includes ground switch circuitry 15 that in turn includes first and second audio signal channels and also includes negative voltage protection circuits 17-1 and 17-2. Negative voltage protection circuits 17-1 and 17-2 prevent negative portions of audio signals in the two channels from forward biasing internal parasitic PN junctions (i.e., PN diodes) in depletion mode "ground switch" transistors MP1 and MP2 of ground switch circuitry 15 and thereby prevent distortion of audio signals in the first and second audio signal channels caused by the negative portions of the audio signals.

The first audio signal channel includes an audio amplifier 8-1 producing an audio output signal on conductor 7-1, and also includes a resistive voltage divider including speaker resistance R2-1 coupled between output 7-1 of amplifier 8-1 and an output conductor 6-1 on which $V_{OUT1}$ is produced. Audio amplifier 8-1 is included in a conventional CODEC 11-1. CODEC 11-1 has a ground sense input connected to output conductor 6-1. (The signal on conductor 6-1 is typically used to provide internal compensation in audio CODEC 11. A ground noise resistor R1-1 is connected between $V_{OUT1}$ conductor 6-1 and ground.) "Ground resistor" R1-1 may be 7 ohms and produces a signal on $V_{OUT1}$ that allows CODEC 11-2 to reduce ground noise or "hum" when depletion mode transistor MP1 is in its high impedance OFF condition if no audio signal is present in the first audio channel. The low impedance path of depletion mode transistor MP1 when it is in its ON condition reduces popping/clicking noise. The audio "hum" is reduced by both ground resistance R1-1 and circuitry in audio CODEC 11-1. Headset speaker resistance R2 of external headset 13-1 may be 16 ohms and ground resistor R1-1 may be 7 ohms.

Similarly, the second audio signal channel includes an audio amplifier 8-2 producing an audio output signal on conductor 7-2, and also includes a resistive voltage divider including another headset speaker resistance R2-2 of another external headset 13-2 coupled between output 7-2 of amplifier 8-2 and an output conductor 6-2 on which an audio output signal $V_{OUT2}$ of the second audio signal channel is generated. A ground resistor R1-2 is connected between output conductor 6-2 and ground.

Ground switch circuitry 15 also includes a conventional charge pump 2 coupled between a positive supply voltage $V_{DD}$ and the system ground. Charge pump 2 produces an output voltage $V_{CP}$ on a control conductor 3. Charge pump 2 discharges $V_{CP}$ to zero volts if $V_{DD}$ falls below its "undervoltage lockout threshold". The charge pump output voltage $V_{CP}$ is coupled by control conductor 3 to the gate electrodes of P-channel MOS (metal oxide semiconductor) depletion mode field effect ground switch transistors MP1 and MP2 which are normally in their conductive or ON state when $V_{CP}$ is equal to zero volts. When $V_{DD}$ is at a normal level, for example 3.3 volts, then charge pump output voltage $V_{CP}$ is boosted from 0 volts to a substantially higher level, approximately +7 volts in the example of FIG. 4. (Note that there could be two or more parallel charge pumps that are selectable so as to support two or more different voltage levels of $V_{DD}$, and the charge pumps could have various architectures, such as a closed loop charge pump architecture. Furthermore, it would be possible to omit the charge pump if the high-voltage level of $V_{CP}$ could be externally supplied by the user as a relatively high supply voltage; that relatively high supply voltage could be switched so as to provide a control signal that is substantially equivalent to $V_{CP}$ on control conductor 3. However, in most cases this approach would be highly impractical and costly.)

Figure 5:
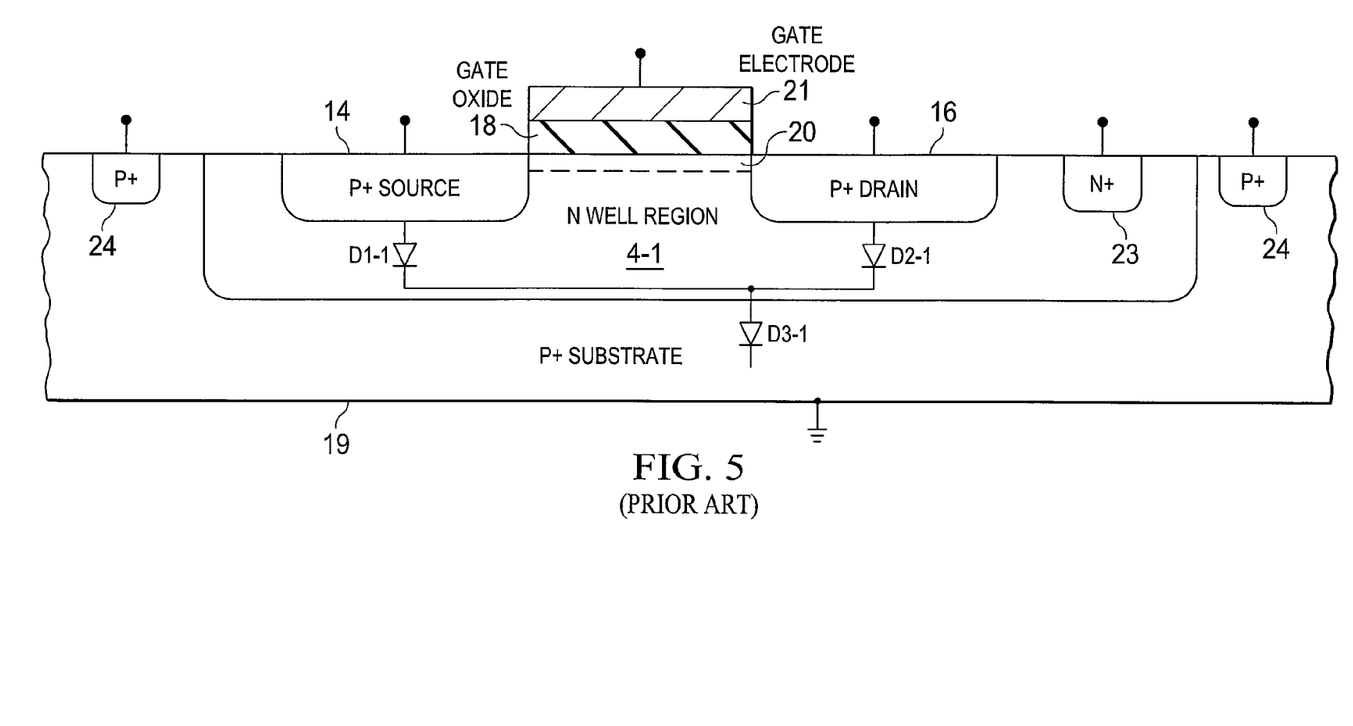
FIG. 5 is an integrated circuit section view of the P-type depletion mode transistor MP1 in FIG. 4 illustrating the source and drain regions, the N-type well region, the P-type substrate, and the associated parasitic diodes.

The source electrode of depletion mode transistor MP1 is connected to $V_{OUT1}$ conductor 6-1, and the source of depletion mode transistor MP2 is connected to $V_{OUT2}$ conductor 6-2. The drain electrodes of depletion mode transistors MP1 and MP2 are connected to ground. Depletion mode transistor MP1 has a P-type source region 14 and a P-type drain region 16 formed in an N-type well region 4-1 of depletion mode transistor MP1 as shown in subsequently described Prior Art FIG. 5, and depletion mode transistor MP2 has a similar structure in its own well region. N-type well region 4-1 of depletion mode transistor MP1 is disposed on a P-type substrate 19, as shown in FIG. 5. The P-type source 14 and the N-type well region 4-1 of depletion mode transistor MP1 form an associated parasitic diode D1-1 which has a substantial parasitic capacitance, and the P-type drain region 16 and the N-type well region 4-1 of depletion mode transistor MP1 form an associated parasitic diode D2-1 which also has a substantial parasitic capacitance. The N-type well region 4-1 and above mentioned P-type substrate together form an associated parasitic "substrate diode" D3-1 having a substantial parasitic capacitance.

In the integrated circuit section view of FIG. 5, it can be seen that P-channel depletion mode transistor MP1 includes P-type source region 14 and a P-type drain region 16 formed in N-type well region 4-1, which is formed on P-type substrate 19. A gate oxide 18 is formed over the P-type channel region 20 extending immediately under gate oxide 18 from the edge of the P-channel source region 14 to the edge of the P-channel drain region 16. A gate electrode 21 is formed on the upper surface of gate oxide 18. An N+ contact region 23 allows low-resistance electrical contact to N-type well region 4-1, and P+ regions 24 allow low-resistance context to P+ substrate 19. Above-mentioned parasitic diode D1-1 includes the PN junction between source region 14 and well region 4-1. Parasitic diode D2-1 includes the PN junction between drain region 16 and well region 4-1, and substrate diode D3-1 includes the PN junction between substrate region 19 and well region 4-1.

In FIG. 4, the output of audio amplifier 8-1 on conductor 7-1 is a relatively large-amplitude audio signal having a range of, for example, ±2.63 volts. The divided-down output voltage on conductor 7-1 of audio amplifier 8-1 appears as $V_{OUT1}$ on conductor 6-1 and would have a range of ±0.8 volts if depletion mode transistor MP1 were OFF instead of ON. However, if depletion mode transistor MP1 is in its ON condition, its very low channel resistance is in parallel with ground resistor R1 and causes the magnitude of $V_{OUT1}$ to be insufficient to cause forward biasing of any of the parasitic diodes.

If $V_{DD}$ has a sufficiently large value to cause charge pump output voltage $V_{CP}$ to be equal to approximately +7 volts, that results in a sufficiently high magnitude of the gate-to-source voltage of depletion mode ground switch transistor MP1 to turn depletion mode transistor MP1 completely OFF (i.e., to switch MP1 into its high-impedance state). The full ±0.8 volt divided-down output value of $V_{OUT1}$ on conductor 6-1 therefore can be applied to a headset resistance R2-1 that is connected between amplifier output conductor 7-1 and $V_{OUT1}$ conductor 6-1.

Ground switch circuitry 15 also includes negative voltage protection circuit 17-1 which ensures that well region 4-1 of depletion mode transistor MP1 is always biased such that none of its associated parasitic diodes ever become forward biased. It should be understood that the parasitic diodes associated with depletion mode ground switch transistor MP1 are always reversed biased as long as N-type well region 4-1 is connected to the highest voltage associated with MP1. Unfortunately, that highest voltage is not always available to be coupled to well region 4-1 if the highest voltage is connected directly to $V_{OUT1}$ as in Prior Art FIGS. 1-3. Consequently, in that case the substrate diode D3-1 will become forward biased if depletion mode transistor MP1 is in its OFF condition and $V_{OUT1}$ is at its minimum −0.8 volt level. This would introduce unacceptable distortion into $V_{OUT1}$. In contrast to the prior art of FIGS. 1-3, well region bias circuit 17-1 of FIG. 4 avoids this problem.

Negative voltage protection circuit 17-1 includes a P-channel depletion mode "protection" transistor MP3-1 which has its drain connected to well region 4-1, its gate connected to charge pump output voltage $V_{CP}$ conductor 3, and its source connected to the source of another P-channel depletion mode protection transistor MP4-1. Conductor 5-1 is connected to the N-type well regions and to the sources of both of depletion mode protection transistors MP3-1 and MP4-1. Note that all of depletion mode transistors MP1 and MP2 have their own respective well regions, and depletion mode protection transistors MP3-1 and MP4-1 may share a common well region or alternatively they may be formed in separate well regions that are connected together by conductor 5-1. The gate of depletion mode protection transistor MP4-1 is connected to $V_{CP}$ and its drain is connected to $V_{OUT1}$ conductor 6-1. Depletion mode protection transistor MP3-1 includes an associated parasitic diode D6-1 having its anode connected to N-type well region 4-1 and having its cathode connected by conductor 5-1 to a well region of depletion mode protection transistor MP3-1. A parasitic diode D4-1 has its anode connected to the source of depletion mode protection transistor MP3-1 and also has its cathode connected to conductor 5-1. Parasitic diodes D4-1 and D5-1 are short-circuited by conductor 5-1. A parasitic diode D5-1 has its anode connected to the source of depletion mode protection transistor MP4-1 and has its cathode connected to conductor 5-1. A parasitic diode D7-1 has its anode connected by $V_{OUT1}$ conductor 6-1 to the drain of depletion mode protection transistor MP4-1 and its cathode connected to conductor 5-1. The channel-width-to-channel-length ratios of depletion mode protection transistors MP3-1 and MP4-1 are much less than the corresponding ratios of depletion mode protection transistors MP1 and MP2, because they only need to bias the well region 4-1 but do not need to sink any signal current.

In FIG. 4, the gate and drain of an N-channel enhancement mode transistor MN1 are connected to $V_{CP}$ conductor 3, and the source of diode-connected transistor MN1 is connected to well region 4-1. The body electrode of diode-connected N-channel enhancement mode MOS transistor MN1 is connected to ground.

If $V_{DD}$=0 volts is applied to charge pump 2, then $V_{CP}$ is also 0 volts, and therefore $V_{OUT1}$ is coupled to the system ground by the ON channel resistance of MP1. More specifically, if there is no VGS turn-off voltage applied between the gate and source of depletion mode ground switch transistor MP1, then MP1 and depletion mode protection transistors MP3-1 and MP4-1 all are in their ON states and N-type well region 4-1 is connected to $V_{OUT1}$ (which is the highest voltage in the circuit) through the ON resistances of depletion mode protection resistors MP3-1 and MP4-1. Consequently, there is no chance of forward biasing of any of the parasitic diodes.

However, if a substantial value of $V_{DD}$ (e.g., 3.3 volts) is applied to "power up" charge pump 2, then (in this example) $V_{CP}$ may be boosted up approximately +7 volts, and then depletion mode transistor MP1 and depletion mode protection transistors MP3-1 and MP4-1 are in their high impedance OFF states. Therefore the highest voltage in the circuit (i.e., $V_{OUT1}$) is not available to bias N-type well region 4-1. Consequently, enhancement mode transistor MN-1 is used as shown because $V_{CP}$ is equal to approximately 7 volts and the voltage of well region 4-1 is less than the quantity 7-$V_T$ volts. Well-region-charging enhancement mode transistor NM-1 will conduct current and charge N-type well region 4-1 up to $V_{CP}$-$V_T$ and then turn off, ensuring that all of parasitic diodes D1-1, D2-1, and D2-3 are reverse biased.

When charge pump 2 not powered, i.e., if $V_{DD}$=0, $V_{OUT1}$ is effectively short-circuited to ground because charge pump 2 automatically discharges $V_{CP}$ to ground whenever $V_{DD}$=0, and this causes depletion mode transistor MP1 to be in its conductive ON condition. Therefore, diode-connected enhancement mode N-channel transistor MN-1 cannot be in its ON state because it is reverse biased, or in a worst case the voltages of the source, gate, and drain of enhancement mode well region charging transistor MN1 all are equal to zero volts. In that case, depletion mode protection transistors MP3-1 and MP4-1 can allow current to flow through depletion mode transistors MP3-1 and MP4-1 because both are in their conductive ON states since their gates are at ground voltage. Consequently, N-type well region 4-1 will be biased to the voltage level of $V_{OUT1}$ and this will prevent any forward biasing of substrate diode D3-1 or any of the other parasitic diodes when $V_{OUT1}$ is at or near its minimum −0.8 volt level.

When charge pump 2 is powered by $V_{DD}$=3.3 volts, N-type well region 4-1 of depletion mode transistor MP1 will be charged to $V_{CP}$-$V_T$ volts during a short time interval by diode-connected enhancement mode transistor MN1, where $V_T$ is the forward threshold voltage of diode-connected enhancement mode transistor MN1. The above-mentioned short time interval is the transition time for $V_{CP}$ to increase from 0 volts up to approximately +7 volts. (The short time interval also is the time constant of the resistance of diode-connected enhancement mode transistor MN-1 and the capacitance of the parasitic diodes D1-1, D2-1, and D2-3 associated with depletion mode transistor MP1.) Enhancement mode transistor MN1 will turn on for a short amount of time as $V_{CP}$ is rising, allowing current to flow from charge pump 2 through conductor 3 and into N-type well region 4-1, thereby charging well region 4-1 and its parasitic capacitance to $V_{CP}$-$V_T$.

Note that if diode-connected transistor MN1 is omitted, N-type well region 4-1 would be charged to exactly $V_{CP}$, and therefore depletion mode protection transistors MP3-1 and MP4-1 would not turn off because the drain voltage of depletion mode protection transistor MP3-1 would be the same as its gate voltage. Depletion mode protection transistors MP3-1 and MP4-1 therefore would never turn off, so there always would be a current path from the output $V_{OUT1}$ through the protection depletion mode transistors MP3-1 and MP4-1, and that would cause substantial distortion of $V_{OUT1}$. The purpose of diode-connected transistor MN1 is to lower the voltage on the drain of depletion mode protection transistor MP3-1 so the two depletion mode protection transistors MP3-1 and MP4-1 can turn off. The parasitic capacitance associated with well region 4-1 is charged up through diode-connected enhancement mode transistor MN1 until it turns itself off, and thereafter diode-connected enhancement mode transistor MN1 supplies only the negligible amount of current needed to keep well region 4-1 charged to the $V_{CP}$-$V_T$ level.

It should be appreciated that the reason both back-to-back depletion mode transistors MP3-1 and MP4-1 (rather than just one) are needed is because with only one of them (e.g., MP3-1) there would be no suitable way of biasing well region 5-1. For example, if well region 5-1 were directly connected to $V_{OUT1}$, the problem would be that the voltage of $V_{OUT1}$ on conductor 6-1 would be lower than the voltage of well region 4-1 because (in this example) $V_{OUT1}$ is 3.3 volts and well region 4-1 is charged to $V_{CP}$ (which is +7 V in this example) minus the turn-on voltage $V_T$ of diode-connected transistor MN1. Therefore, parasitic diode D6-1 would become forward biased and allow current to flow from charge pump 2 into $V_{OUT1}$ conductor 6-1. To prevent this, back-to-back depletion mode protection transistors MP3-1 and MP4-1 allow well region 4-1 to be charged to the to the level of $V_{CP}$-$V_T$. Reverse biased parasitic diode D7-1 then blocks any of that charge from escaping from well region 5-1, since diode D7-1 is reverse biased.

Ground switch circuitry 15 also includes a second negative voltage protection circuit 17-2 which ensures that well region 4-2 of depletion mode ground switch transistor MP2 is always biased such that none of the parasitic diodes associated with depletion mode transistor MP2 becomes forward biased. Negative voltage protection circuit 17-2 in FIG. 4 avoids this problem because the structure and operation of well bias circuit 17-2 are essentially the same as the structure and operation of well region bias circuit 17-1.

The described embodiment of the invention avoids distortion of audio signals in one or more audio signal channels while allowing a positive level of $V_{OUT1}$ to be applied when no $V_{DD}$ power is being applied charge pump 2, and also while allowing positive and negative levels of $V_{OUT1}$ to be applied when $V_{DD}$ power is being applied to charge pump 2. This enables system engineers to use a higher external ground resistance for noise immunity by tolerating the resulting larger negative voltage swings.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, the described embodiment of the invention is just one example how a self grounding switch transistor inherently short-circuits the output until the grounding switch transistor "wakes up" in response to "waking up" of the "switch control", i.e., to the charge pump. A grounding switch transistor protection circuit generally as described in this invention can be used any application wherein bipolar signals (i.e., signals having both positive and negative values with respect to a ground reference) need to be driven accurately all the time, including during turning the grounding switch transistor on and off. For example, it may be very important to protect a negative voltage to be applied to a precision motor drive circuit to prevent causing a small erroneous angle shift in the position of the rotor. (This would be analogous to the clicking/popping sound in a described audio application.) The invention also may be utilized in various other applications that require a very well controlled drive signal during the powering-up of a device. Also, It may be possible to accomplish the charging function of enhancement mode will region charging transistor MN1 with a different kind of diode, such as an ordinary PN diode, if a PN diode or other diode available in a particular integrated circuit manufacturing process provides the needed voltage drop if a suitable level shifting circuit could be utilized to adjust the charge pump output voltage to make use of a PN diode more practical. Furthermore, it would be possible to omit the charge pump if the high-voltage level of $V_{CP}$ could be externally supplied by the user as a relatively high supply voltage; that relatively high supply voltage could be switched so as to provide a control signal that is substantially equivalent to $V_{CP}$ on control conductor 3. However, in most cases this approach would be highly impractical and costly.

What is claimed is:

1. Self-grounded circuitry comprising:
   (a) a first signal channel conducting a first output signal on a first output conductor;
   (b) a charge pump powered by a first reference voltage and producing a control voltage signal on a control conductor, the control voltage signal having a relatively low value if the first reference voltage is at a relatively low level and having a relatively high value if the first reference voltage is at a relatively high level;
   (c) a ground switch circuit including a first depletion mode transistor having a source coupled to the first output conductor, a gate coupled to receive the control voltage signal, and a drain coupled to a second reference voltage, the first depletion mode transistor having a first well region, a first parasitic diode including a PN junction between the source and the first well region, a second parasitic diode including a PN junction between the drain and the first well region, and a third parasitic diode including a PN junction between the first well region and a substrate ajoining the first well region; and (d) a first negative voltage protection circuit including 1) a first depletion mode protection transistor having a drain coupled to the first well region, a source coupled to a source of a second depletion mode protection transistor having a drain coupled to the first output conductor, the first and second depletion mode protection transistors each having a gate coupled to the control conductor, well regions of the first and second depletion mode protection transistors being connected to their sources, respectively, and 2) a level-shifting circuit coupled between the first well region and the control conductor.

2. The self-grounded circuitry of claim 1 wherein the level-shifting circuit is a diode-connected enhancement mode transistor having a source coupled to the first well region and a gate and a drain both coupled to the control conductor.

3. The self-grounded circuitry of claim 2 wherein the first output signal is an audio frequency signal.

4. The self-grounded circuitry of claim 1 wherein the first signal channel includes a first amplifier, a resistive voltage divider including a first ground noise resistor coupled between the first output conductor and the second reference voltage, and a first resistance of a speaker of an external headset coupled between an output of the first amplifier and the first output conductor.

5. The self-grounded circuitry of claim 2 wherein the first ground noise resistor has a resistance of approximately 7 ohms and wherein the first resistance has a value of approximately 16 ohms.

6. The self-grounded circuitry of claim 2 wherein the first depletion mode transistor is a P-channel MOS depletion mode transistor and the diode-connected enhancement mode transistor is a N-channel enhancement mode MOS transistor.

7. The self-grounded circuitry of claim 1 wherein a channel-width-to-channel-length ratio of the enhancement mode transistor is substantially less than a channel-width-to-channel-length ratio of the first depletion mode transistor.

8. The self-grounded circuitry of claim 4 wherein the first well region is an N-type well region adjoining a P-type substrate.

9. The self-grounded circuitry of claim 2 wherein the diode-connected enhancement mode transistor charges the first well region to a voltage equal to the control voltage signal minus a forward threshold voltage of the diode-connected enhancement mode transistor when the first reference voltage substantially exceeds the relatively low level.

10. The self-grounded circuitry of claim 1 wherein the first depletion mode protection transistor and the second depletion mode protection transistor cooperate to perform the functions of allowing the well region to be charged to the voltage level of the first output conductor while the first depletion mode transistor is in its ON condition, and preventing escape of charge from the well region while the first depletion mode transistor is in its OFF condition by means of a parasitic diode associated with the second depletion mode protection transistor.

11. The self-grounded circuitry of claim 2 wherein a body electrode of the diode-connected enhancement mode transistor is connected to the second reference voltage.

12. The self-grounded circuitry of claim 1 wherein the first well region is an N-type semiconductor layer disposed on a P-type semiconductor substrate, the source and the drain of the first depletion mode transistor are P-type regions in the first well region and are separated by a P-type channel region in the first well region.

13. The self-grounded circuitry of claim 4 wherein the first negative voltage protection circuit operates so as to prevent clicking/popping sounds when the headset is plugged into a jack connected to the first output conductor.

14. The self-grounded circuitry of claim 1 wherein the charge pump operates to cause the control voltage signal to be equal to approximately zero if the first reference voltage is at a relatively low level.

15. The self-grounded circuitry of claim 1 including a second signal channel conducting a second output signal on a second output conductor, wherein the ground switch circuit further includes a second depletion mode transistor having a source coupled to the second output conductor and having a structure essentially the same as the first depletion mode transistor, and wherein the ground switch circuit also includes a second well region protection circuit that is essentially the same as the first well region protection circuit.

16. A method for preventing distortion of an output signal caused by ground switch circuitry in a self-grounding switch circuit, the method comprising:

(a) providing the output signal on an output conductor;

(b) operating a charge pump powered by a first reference voltage to produce a control voltage signal on a control conductor, the control voltage signal having a relatively low value if the first reference voltage is at a relatively low level and having a relatively high value if the first reference voltage is at a relatively high level;

(c) applying the control voltage signal to a gate of a depletion mode ground switch transistor having a source coupled to the output conductor and a drain coupled to a second reference voltage, the depletion mode ground switch transistor having a well region, a first parasitic diode including a PN junction between the source and the well region, a second parasitic diode including a PN junction between the drain and the well region, and a third parasitic diode including a PN junction between the well region and a substrate ajoining the well region; and (d) coupling the well region to a drain of a first depletion mode protection transistor having a drain coupled to the well region, a source coupled to a source of a second depletion mode protection transistor having a drain coupled to the output conductor, coupling a gate of each of the first and second depletion mode protection transistors to the control conductor, coupling a level-shifting circuit between the well region and the control conductor, and coupling well regions of the first and second depletion mode protection transistors to their sources, respectively.

17. The method of claim 16 including operating the first depletion mode protection transistor and the second depletion mode protection transistor to charge the well region to the voltage level of the first output conductor while the depletion mode transistor is in its ON condition, and preventing escape of charge from the well region while the first depletion mode transistor is in its OFF condition by means of a parasitic diode associated with the second depletion mode protection transistor.

18. The method of claim 16 wherein the level-shifting circuit is a diode-connected enhancement mode transistor, the method including operating the diode-connected enhancement mode transistor to charge the well region to a voltage equal to the control voltage signal minus a forward threshold voltage of the diode-connected enhancement mode transistor when the first reference voltage substantially exceeds the relatively low level.

19. The method of claim 18 including using P-channel depletion mode transistors as the depletion mode ground switch transistor and as the first and second depletion mode protection transistors, the method also including using a N-channel enhancement mode transistor as the diode-connected enhancement mode transistor.

20. Circuitry for preventing distortion of an output signal caused by ground switch circuitry in an AC signal circuit, comprising:
   (a) means for providing the AC output signal on an output conductor;
   (b) a charge pump powered by a first reference voltage to produce a control voltage signal on a control conductor, the control voltage signal having a relatively low value if the first reference voltage is at a relatively low level and having a relatively high value if the second reference voltage is at a relatively high level;
   (c) means for applying the control voltage signal to a gate of a depletion mode ground switch transistor having a source coupled to the output conductor and a drain coupled to a second reference voltage, the depletion mode ground switch transistor having a well region, a first parasitic diode including a PN junction between the source and the well region, a second parasitic diode including a PN junction between the drain and the well region, and a third parasitic diode including a PN junction between the well region and a substrate ajoining the well region;
   (d) means for charging the well region to the voltage level of the first output conductor while the first depletion mode ground switch transistor is in its ON condition, and preventing escape of charge from the well region while the first depletion mode ground switch transistor is in its OFF condition by means of a parasitic diode associated with the second depletion mode protection transistor; and
   (e) means for charging the well region to a voltage equal to the control voltage signal minus a forward threshold voltage of the diode-connected enhancement mode transistor when the first reference voltage substantially exceeds the relatively low level thereof so the depletion mode ground switch transistor is in its OFF condition.

* * * * *